United States Patent [19]
Yoshio

[11] Patent Number: 5,157,396
[45] Date of Patent: Oct. 20, 1992

[54] D/A CONVERSION APPARATUS
[75] Inventor: Junichi Yoshio, Saitama, Japan
[73] Assignee: Pioneer Electronic Corporation, Tokyo, Japan
[21] Appl. No.: 765,733
[22] Filed: Sep. 26, 1991
[30] Foreign Application Priority Data
Oct. 15, 1990 [JP] Japan .................................. 2-275705
[51] Int. Cl.$^5$ ...................... H03M 1/66; H03M 1/06
[52] U.S. Cl. ..................................... 341/144; 341/118
[58] Field of Search ....................... 341/144, 126, 118; 360/32; 369/54; 381/63; 358/335, 342, 343, 341

[56] References Cited
U.S. PATENT DOCUMENTS
4,665,513 5/1987 Wengler .................................. 369/54
4,926,179 5/1990 Yoshioka .............................. 341/144

Primary Examiner—Sharon D. Logan
Attorney, Agent, or Firm—Sughrue, Mion, Zinn, Macpeak & Seas

[57] ABSTRACT

A D/A conversion apparatus includes a high-frequency amplifying and interpolating circuit for amplifying and interpolating only a high-frequency component of an input digital signal so as to produce an amplified and interpolated component together with the other components except the high-frequency component; a D/A converting circuit for converting an output digital signal of the high-frequency amplifying and interpolating circuit into an analog signal; and a suppressing circuit for suppressing a high-frequency component of the analog signal. Accordingly, the apparatus produces an audio signal waveform in which quantizing noise is reduced and high-frequency sound characteristics are improved.

20 Claims, 6 Drawing Sheets

D/A CONVERSION APPARATUS

BACKGROUND OF THE INVENTION

1. Field of the Invention

The present invention relates to a digital/analog (D/A) conversion apparatus for converting a digital signal into an analog signal.

2. Description of the Related Art

Generally, musical tone acoustic energy decreases as the frequency thereof increases. Accordingly, regardless of its high or low frequency band, when a musical tone audio signal is quantized with the same pitch into a digital signal, quantizing noise becomes relatively large in the high-frequency band. That is, in a playing apparatus such as a compact disk (CD) player or the like for playing a recording medium carrying digital data recorded thereon, the digital signal obtained by sound reproducing already includes quantizing noise in the high-frequency band. For example, in the case of a compact disk, since 16-bit digital data is obtained with a sampling frequency of 44.1 kHz, a 1 kHz sine wave having a minute level of $-90$dB changes only in the least significant bit (LSB) of the digital data, as shown in FIG. 13. Accordingly, the reproduced sound of an analog signal obtained by D/A converting digital data has poor-sounding high-frequency characteristics because of the quantizing noise.

SUMMARY OF THE INVENTION

It is therefore an object of the present invention to provide a D/A conversion apparatus in which the undesirable influence due to quantizing noise is eliminated so as to improve the high-frequency sound characteristic.

The D/A conversion apparatus according to the present invention, includes a high-frequency amplifying and interpolating circuit for amplifying and interpolating only a high-frequency component of an input digital signal so as to produce an amplified and interpolated component together with the other components except the high-frequency component; a D/A converting circuit for converting an output digital signal of the high-frequency amplifying and interpolating circuit into an analog signal; and a suppressing circuit for suppressing a high-frequency component of the analog signal.

In the D/A conversion apparatus according to the o present invention, only the high-frequency component of the input digital signal is amplified and interpolated. The amplified and interpolated component is D/A converted together with the digital signal component excluding the high-frequency component of the input digital signal, and then the high-frequency component is suppressed, so as to produce an audio signal waveform in which quantizing noise is reduced. Accordingly, the auditory characteristics in a high-frequency band can be improved.

BRIEF DESCRIPTION OF THE DRAWINGS

The invention will be more clearly understood from the following description in conjunction with the accompanying drawings, wherein.

DESCRIPTION OF THE PREFERRED EMBODIMENTS

Figure 1:
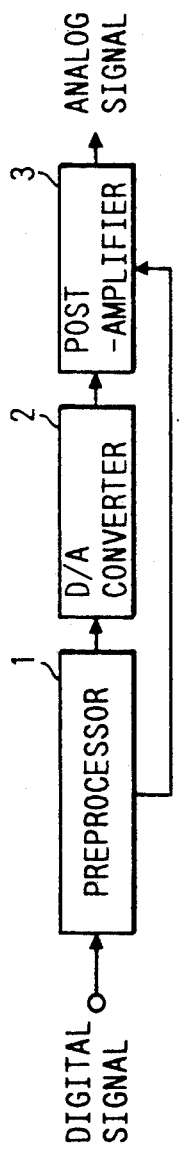
FIG. 1 is a block diagram showing a first embodiment of the present invention.

Referring to the drawings, embodiments of the present invention will be described in detail below.

FIG. 1 shows a first embodiment of a D/A conversion apparatus according to the present invention. Typically, the D/A conversion apparatus is provided in a compact disk player for reproducing a music signal from a compact disk or the like that serves as a recording medium on which an audio signal has been recorded as digital data.

In the D/A conversion apparatus, a digital audio signal which is a digitally represented music signal or the like is obtained, for example, by reading a compact disk, is supplied to a preprocessor 1. The preprocessor 1 performs level-up and interpolation of the high-frequency components of the digital audio signal. The configuration of the preprocessor 1 will be described in detail below. An ordinary D/A converter 2 is connected to an output terminal of the preprocessor 1. A post-amplifier 3 serving as a suppressing unit is connected to an output terminal of the D/A converter 2. The post-amplifier 3 has a high-frequency attenuation characteristic. That is, the post-amplifier 3 has a gain which changes in response to a gain control signal so that the post-amplifier 3 lowers the level of the high-frequency components of the analog audio signal output from the D/A converter 2. The analog audio signal output from the post-amplifier 3 is the above-mentioned music signal which is output from the compact disk player.

Figure 2:
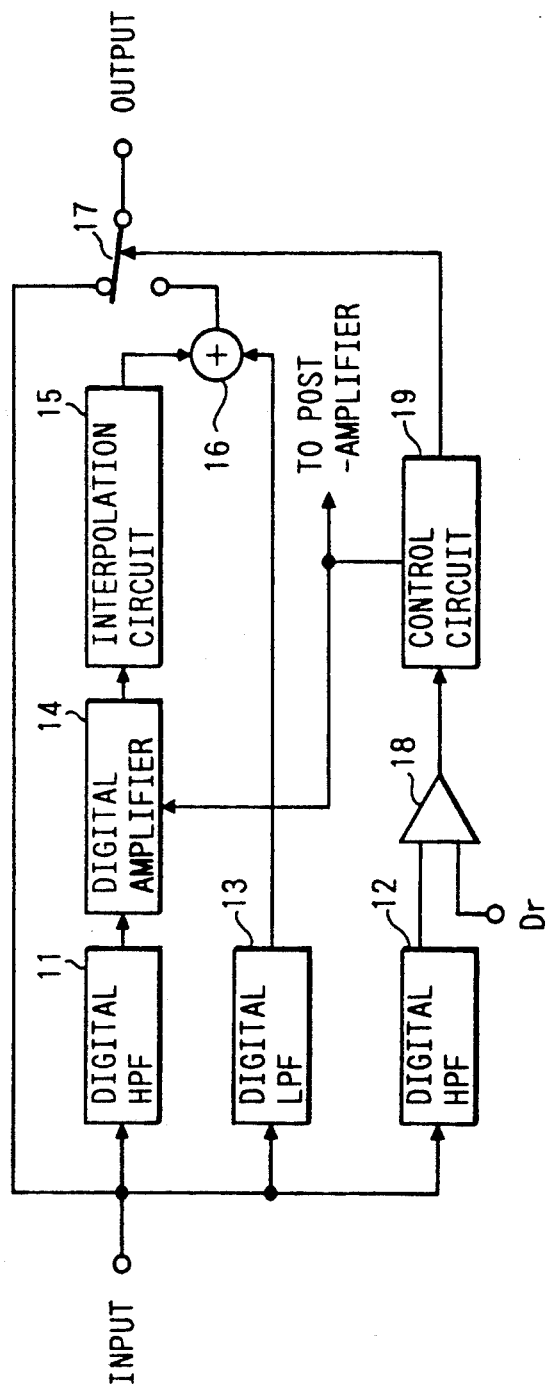
FIG. 2 is a block diagram showing a first configuration of a preprocessor in the converter of FIG. 1.

In FIG. 2, which is a block diagram showing a first configuration of a preprocessor 1 in the D/A conversion apparatus, digital high-pass filters (HPFs) 11 and 12 and a digital low-pass filter (LPF) 13 are connected to an input terminal. Each of the digital HPFs 11 and 12 passes only a high-frequency component of a digital signal. Although the HPFs 11 and 12 are separately illustrated in FIG. 2, one of them can be eliminated since they perform the same function. The LPF 13 passes only components other than the high-frequency components of the digital signal which are passed through the HPFs 11 and 12.

A digital amplifier 14 is connected to an output terminal of the HPF 11. The digital amplifier 14 amplifies the high-frequency components of the digital audio signal output from the HPF 11 with a predetermined frequency characteristic and has a gain which changes over the frequency band in response to a gain control signal.

An interpolation circuit 15 is connected to an output terminal of the digital amplifier 14. An output signal of the interpolation circuit 15 and an output signal of the LPF 13 are added to each other by an adder 16. An output signal of the adder 16 is supplied to a switch circuit 17. The switch circuit 17 selectively outputs one of the input digital audio signal (switch position "a") and the output signal of the adder 16 in response of a switching control signal (switch position "b").

A comparator 18, connected to an output terminal of the HPF 12, compares an output value of the HPF 12 and a reference value Dr. When the output value of the HPF 12 is not lower than the reference value Dr, the comparator 18 generates a low-level output. On the other hand, when the output value of the HPF 12 is lower than the reference value Dr, the comparator 18 generates a high-level output.

A control circuit 19 is connected to an output terminal of the comparator 18. The control circuit 19 changes the contents of the gain control signal in accordance with the output level of the comparator 18 so as to generate the switching control signal for the switch circuit 17. The gain control signal, which is a digital signal constituted by a plurality of bits, is supplied to the post-amplifier 3 and the digital amplifier 14.

The control circuit 19 includes, for example, an up-down counter and a delay element. When a high-level output is detected by the comparator 18, the control circuit 19 immediately generates an active switching control signal causing the switch circuit 17 to switch to position "b" and at the same time the up-down counter counts up. The count value of the up-down counter is output as the gain control signal.

The up-count value goes from a lower limit to an upper limit in a first predetermined time (a decay time). When a low-level output is generated from the comparator 18, the control circuit 19 generates an inactive switching control signal, causing the switch circuit 17 to switch to position "a" after a delay of a second predetermined time (an attack time) by means of the delay element, and the up-down counter counts down. The down-count value goes from the upper limit to the lower limit in the second predetermined time. The first and second predetermined times may be equal to each other.

Figure 3A:
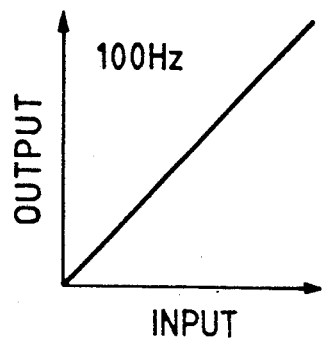
FIGS. 3(a) through 3(c) show input-output characteristics of the preprocessor at various frequencies.
Figure 3B:
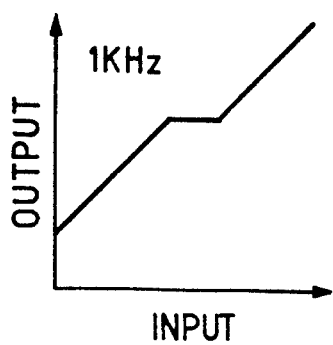
Figure 3C:
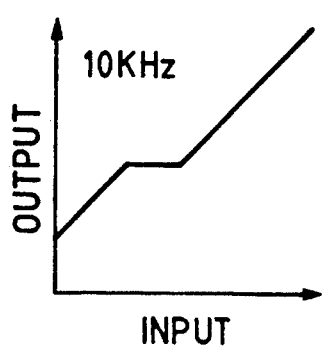

The input-output characteristics of the preprocessor 1 vary depending on the frequency. For example, at 100 Hz, 1 kHz, and 10 kHz, the input-output characteristic changes as shown in FIGS. 3(a), 3(b) and 3(c), respectively.

In such a configuration, the high-frequency component of the input digital audio signal is extracted by the HPF 12. In the case where the level of the high-frequency component is not lower than the reference value Dr, the comparator 18 generates a low level output. In the state in which the low level continues, the input digital audio signal is supplied directly to the D/A converter 2 through the switch circuit 17 (at switch position "a") so as to be converted into an analog signal. The analog signal is amplified by the post-amplifier 3, and is output from the apparatus. At this time, the post-amplifier 3 is caused to have an initial frequency characteristic in accordance with the gain control signal supplied to the control input terminal of the post-amplifier 3, so that the analog signal obtained by the D/A converter 2 is output correctly without its high-frequency component being attenuated.

Figure 4A:
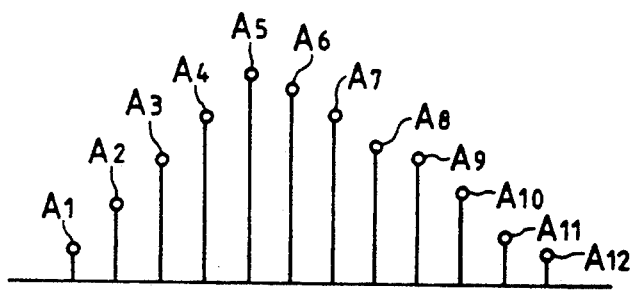
FIGS. 4(a) and 4(b) show an interpolating operation.
Figure 4B:
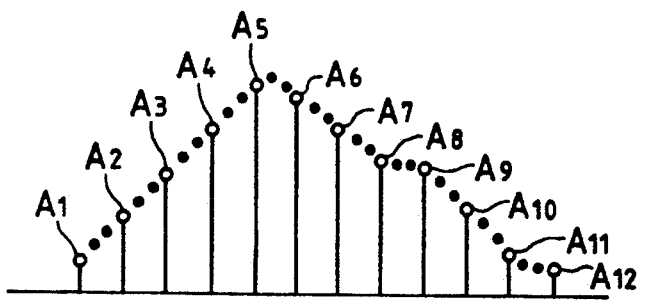

When the level of the high-frequency component of the input digital audio signal extracted by the HPF 12 becomes lower than the reference value Dr, the output level of the comparator 18 is inverted from a low level to a high level. A switching control signal is supplied from the control circuit 19 to the switch circuit 17 in response to this inversion, and the switch circuit 17 is switched to switch position "b" so as to output the output digital signal of the adder 16 in response to the active switching control signal. Further, the gain control signal output from the control circuit 19 changes. The gain of the digital amplifier 14 gradually rises in response to the gain control signal, so that the high-frequency component output from the HPF 11 is amplified by the digital amplifier 14. After the attack time passes, the gain of the digital amplifier 14 stops rising so as to keep the gain at a fixed value. The output signal of the digital amplifier 14 is supplied to the interpolation circuit 15 so that data between consecutive digital data values are formed through interpolation. For example, in the case where digital data $A_1 - A_{12}$ change as shown in FIG. 4(a), the data between the digital data are formed in accordance with the change state of the digital data as shown by black dots in FIG. 4(b). Since the interpolation operation is disclosed in Japanese Patent Unexamined Publication No. Hei. 1-296714, the interpolating operation will not be IS described further.

A digital signal output from the interpolation circuit 15 is added to an output signal output from the LPF 13 in the adder 16. An output signal of the adder 16 is supplied to the D/A converter 2 through the switch circuit 17 so as to be converted into an analog signal. The analog signal is amplified by the post-amplifier 3 and is output from the apparatus. At this time, the post-amplifier 3 is caused to have an attenuation characteristic which is contrary to the amplification characteristic of the digital amplifier 14 in a high-frequency band in accordance with the gain control signal supplied to the control input terminal. As a result, the high-frequency component of the analog signal obtained by the D/A converter 2 is attenuated before being output.

When the level of the high-frequency component of the input digital audio signal extracted by the HPF 12 is higher than that of the reference value Dr, the output level of the comparator 18 is inverted from a high level to a low level. The gain control signal output from the control circuit 19 changes in response to this inversion. The gain of the digital amplifier 14 gradually decreases in response to the gain control signal, so that the amplification on the high-frequency component output from the HPF 11 by the digital amplifier 14 becomes low gradually. Further, when the decay time has passed from the inversion, the control circuit 19 generates the inactive switching control signal, so that the switch circuit 17 is switched to switch position "a" so as to output the input digital audio signal as it is. That is, when the switch circuit 17 is in switch position "a", the input digital signal passes through the preprocessor 1 without alteration.

Figure 5:
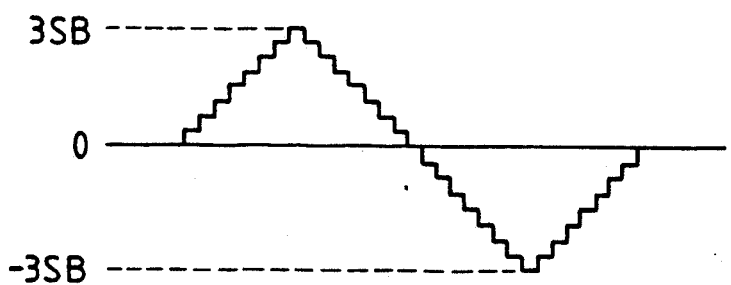
FIG. 5 is a view showing digital data obtained by the preprocessor.
Figure 13:
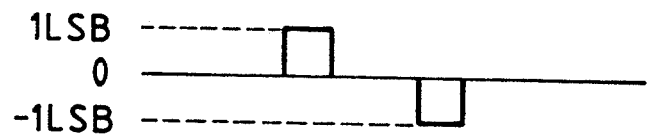
FIG. 13 is a view showing a sine wave constituted a high-frequency component in a fine level as digital data.

Accordingly, although in the sine wave shown in FIG. 13 only the least significant bit (LSB) of digital data changes, level conversion is performed in the preprocessor 1 in a manner so that a waveform as shown in FIG. 5, for example, is obtained. Thus, the digital data obtained has substantially the same waveform as an actual sine wave.

Figure 6:
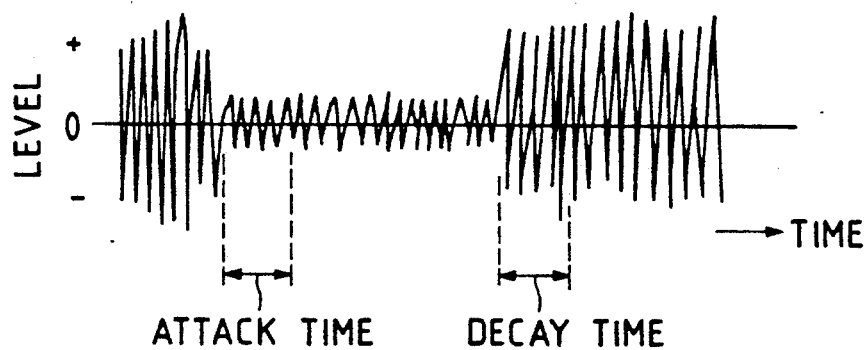
FIG. 6 is a view showing an attack time and a decay time.

The attack time and decay time are shown on an audio signal waveform as shown in FIG. 6. That is, the attack time appears when the audio signal level becomes ZS less than the reference value Dr. In the attack time, the level of the high-frequency component is gradually raised. After the attack time has passed, the gain for the amplification of the level of the high-frequency component is constant. Thereafter, when the audio signal level becomes greater than or equal to the reference value Dr, the decay time appears. In the decay time, the level of the high-frequency component is gradually reduced. After the decay time has passed, the level of the high-frequency component is no longer controlled.

However, even if the level of the audio signal becomes less than the reference value Dr, or even if the audio signal level becomes greater than or equal to the reference value Dr, unless the state continues for a predetermined time, the level of the high-frequency component is not controlled so as to be raised or lowered. Although the predetermined time is included in each of the attack time and the decay time, it is not necessary that the attack time and the decay time be equal to each other.

Figure 7:
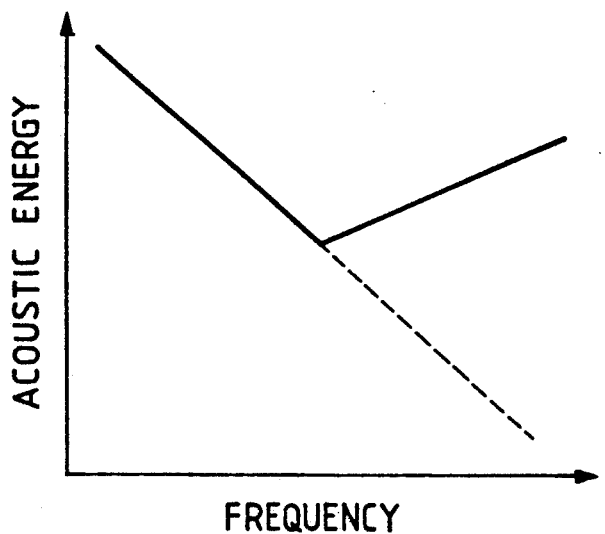
FIG. 7 is a view showing a frequency distribution characteristic of acoustic energy.

Thus, as illustrated in FIG. 7, in the apparatus according to the present invention, the frequency distribution characteristic of musical tone acoustic energy fluctuates from the characteristic indicated by a broken line toward the characteristic indicated by a solid line in a high-frequency band because of the attack time when the high-frequency component becomes lower than the reference value Dr. After the attack time has passed, the frequency distribution characteristic is made to have the characteristic indicated by the solid line. When the high-frequency component becomes equal to or higher than the reference value Dr, the frequency distribution characteristic fluctuates from the solid-line characteristic toward the broken-line characteristic in the high-frequency band because of the decay time. After the decay time has passed, the frequency distribution characteristic returns to the broken-line characteristic.

Although the gain for the amplification of the high-frequency component is gradually changed in each period of the attack time and the decay time in the embodiment described above, the amplification gain may be immediately changed to a desired amplification gain immediately after the attack time or the decay time has passed.

Figure 8:
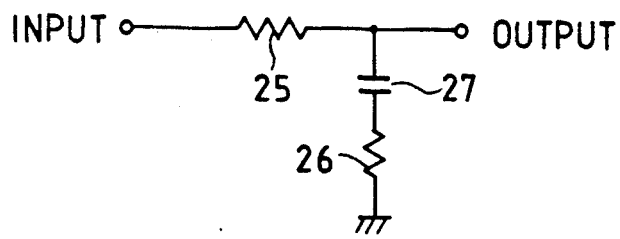
FIG. 8 is a circuit diagram showing a low-pitched voice booster circuit.
Figure 9:
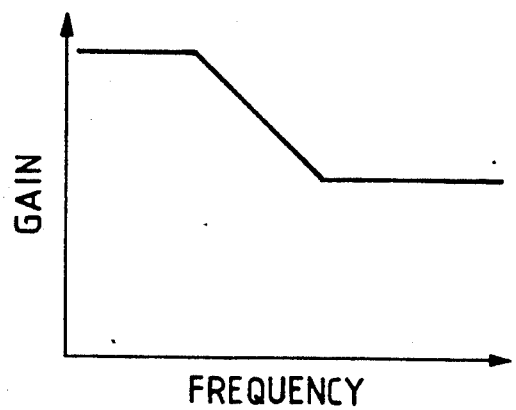
FIG. 9 is a view showing the frequency characteristic of the circuit of FIG. 8.

Further, the suppressing circuit is not limited to the above-mentioned post-amplifier 3. For example, the suppressing circuit may be a low-pitched voice booster circuit constituted by resistors 25 and 26 and a capacitor 27 as shown in FIG. 8, so as to obtain a frequency characteristic as shown in FIG. 9.

Figure 10:
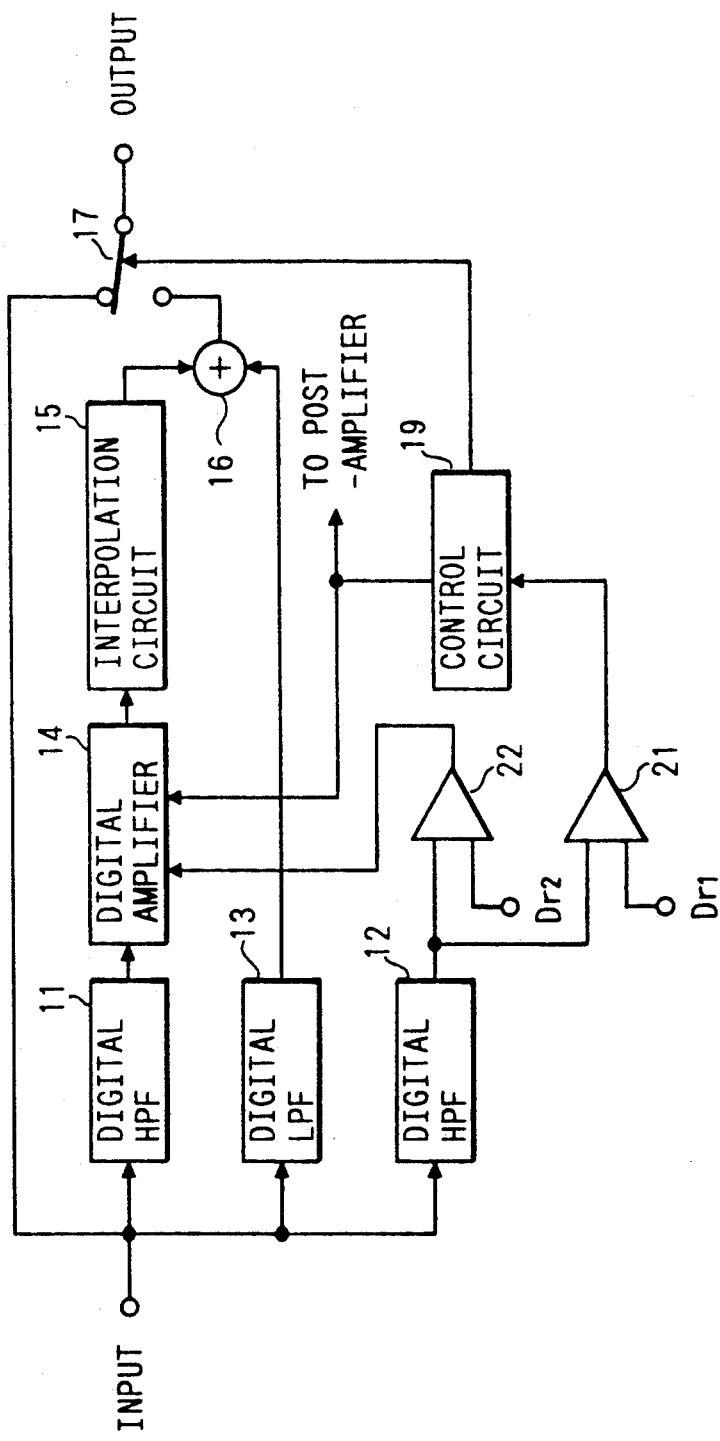
FIG. 10 is a block diagram showing a second configuration of the preprocessor.

FIG. 10 shows a second configuration of the preprocessor 1. In this preprocessor 1, two comparators 21 and 22 are connected to an output terminal of a HPF 12. The comparator 21 compares an output value of the HPF 12 and a first reference value Dr1. When the output value of the HPF 12 is greater than or equal to the first reference value Dr1, the comparator 21 generates a low-level output. When the output value of the HPF 12 is lower than the first reference value Dr1, the comparator 21 generates a high level output. The comparator 22 compares the output value of the HPF 12 and a second reference value Dr2. When the output value of the HPF 12 is greater than or equal to the second reference value Dr2, the comparator 22 generates a low-level output. When the output value of the HPF 12 is lower than the second reference value Dr2, the comparator 22 generates a high level output. The first reference value Dr1 is higher than the second reference value Dr2. An output terminal of the comparator 21 is connected to a control circuit 19. The control circuit 19 generates a gain control signal and a switching control signal in response to the output level of the comparator 21. An output terminal of the comparator 22 is connected to a digital amplifier 14.

In the second configuration, the digital amplifier 14 has two frequency characteristics which are different from each other. When the comparator 22 generates the low level output, the digital amplifier 14 uses one frequency characteristic to amplify the input digital signal with a gain determined by the gain control signal. On the other hand, when the comparator 22 generates the high level output, the digital amplifier 14 uses the other frequency characteristic so as to amplify the input digital signal with the gain determined by the gain control signal. The other circuitry and operations in FIG. 10 are similar to those of the first configuration of the circuit illustrated in FIG. 2. The frequency characteristic of the post-amplifier 3 may also be changed in response to the output level of the comparator 22.

Figure 11:
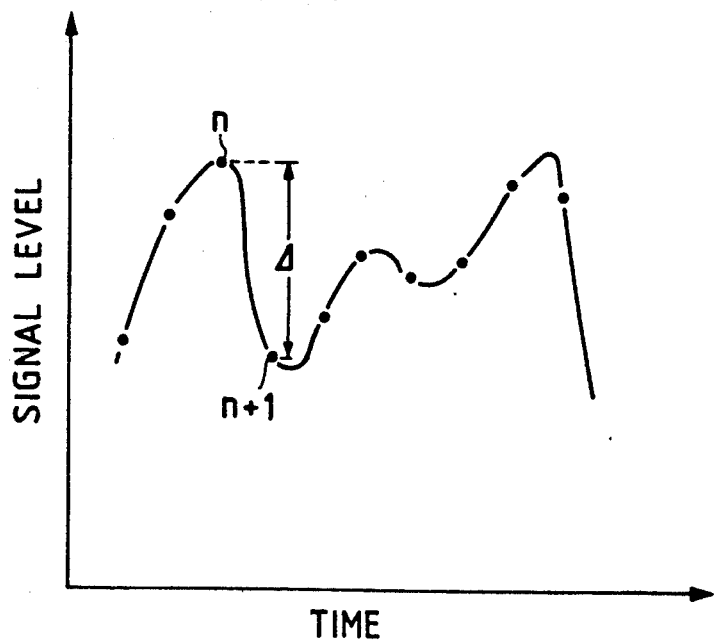
FIG. 11 is a view for explaining a method for distinguishing digital signal data showing a high-frequency component.
Figure 12:
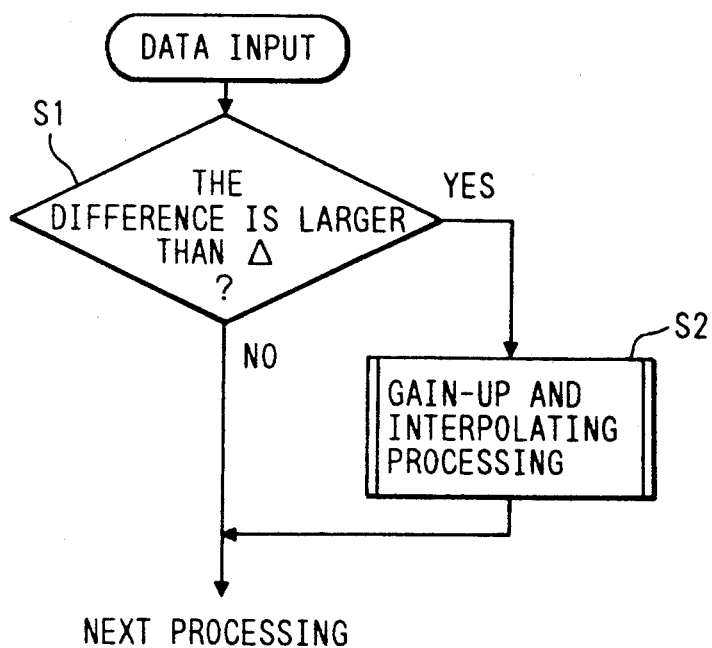
FIG. 12 is a flow chart showing the operation of a digital signal processor according to a second embodiment of the present invention.

Although the high-frequency component of the digital signal is separated from the other component by the HPFs and the LPF in each of the first and second configurations of the preprocessor 1 in the first embodiment, the present invention is not limited to such configurations. For example, as shown in FIG. 11, when the difference between two continuous data n and n+1 is larger than a predetermined value, such data can be determined to be a high-frequency component in a data train of a changing digital signal. Thus, according to a second embodiment of the present invention, the preprocessor 1 is constituted by a digital signal processor. The operations performed by the digital signal processor are shown in FIG. 12. Initially, it is determined whether the difference between the input digital signal data and the data input immediately before the input digital signal data is larger than a predetermined value $\Delta$ (step S1). If the data difference is not larger than the predetermined value $\Delta$, the operation is shifted to the next processing (for example, output processing). If the data difference is larger than the predetermined value $\Delta$, up-gain and interpolation processing are performed (step S2), and then the operation is shifted to the next processing.

As described above, in the D/A converter according to the present invention, only the high-frequency component of the input digital signal is amplified and interpolated. The amplified and interpolated signal is converted into an analog signal together with the components of the input digital signal other than the high-frequency component. Thereafter, the high-frequency component of the analog signal is suppressed. Accordingly, a quantizing noise which is relatively large in a high-frequency band in the digital signal can be reduced, so that an auditory characteristic in the high-frequency band can be improved.

In addition, according to the present invention, a interpolation circuit generally having a complicated and large-scaled configuration interpolates only the high-frequency portion, so that the constituent scale is small and the circuit can be formed in an integrated circuit.

Further, the D/A converter according to the present invention can be used not only for a compact disk player described above but for any apparatus, such as a digital audio tape (DAT) player, etc., which requires processing to convert from a digital signal into an analog signal.

Many features and advantages of the invention are apparent from the detailed specification and thus it is intended by the appended claims to cover all such features and advantages of the invention which fall within the true spirit and scope thereof. Further, since numerous modifications and changes will readily occur to those skilled in the art, it is not desired to limit the invention to the exact construction and operation illustrated and described, accordingly all suitable modifications and equivalents may be resorted to as falling within the scope of the invention.

What is claimed is:

1. A digital-to-analog (D/A) conversion apparatus comprising:
   a high-frequency amplifying and interpolating circuit for amplifying and interpolating only a high-frequency component of an input digital signal to produce an amplified and interpolated high-frequency component together with components other than said high-frequency component as an output digital signal;
   D/A converting means for converting said output digital signal of said high-frequency amplifying and interpolating circuit into an analog signal; and
   suppressing means for suppressing a high-frequency component of said analog signal.

2. A D/A conversion apparatus according to claim 1, wherein high-frequency amplifying and interpolating circuit gradually increases an amplification factor when the level of said high-frequency component of said input digital signal becomes lower than a reference value, and gradually decreases said amplification factor when the level of said high-frequency component of said input digital signal becomes higher than said reference value.

3. A D/A conversion apparatus according to claim 2, wherein said suppressing means gradually increases a suppression factor when the level of said high-frequency component of said input digital signal becomes lower than said reference value, and gradually increases said suppression factor when the level of said high-frequency component of said input digital signal becomes higher than said reference value.

4. A D/A conversion apparatus according to claim 1,
   wherein said high-frequency amplifying and interpolating circuit has a first frequency characteristic, and
   wherein said high-frequency amplifying and interpolating circuit changes the first frequency characteristic in response to the level of said high-frequency component of said input digital signal.

5. A D/A conversion apparatus according to claim 4,
   wherein said suppressing means has a second frequency characteristic, and
   wherein said suppressing means changes the second frequency characteristic in response to the level of said high-frequency component of said input digital signal.

6. A D/A conversion apparatus according to claim 1, wherein said input digital signal is a reproduced digital signal reproduced from a recording medium carrying digital data recorded thereon, and an output of said suppressing means is an audio signal obtained by D/A converting said reproduced digital signal.

7. A D/A conversion apparatus according to claim 1, wherein said input digital signal is a musical tone audio signal.

8. A method for converting a digital signal into an analog signal, comprising the following steps:
   (a) receiving a digital signal having high and low frequency components;
   (b) obtaining the high frequency components of the digital signal;
   (c) obtaining the low frequency components of the digital signal;
   (d) amplifying the high frequency components according to an amplification factor to produce amplified high frequency components;
   (e) interpolating the amplified high frequency components to produce interpolated high frequency components;
   (f) adding the low frequency components and the interpolated high frequency components to produce an output digital signal;
   (g) converting the output digital signal into an analog signal; and
   (h) suppressing a high frequency component of the analog signal.

9. A method according to claim 8, wherein the digital signal is a musical tone audio signal.

10. A method according to claim 8, wherein said amplifying step comprises:
    (d1) comparing levels of the high frequency components with a reference value to produce a comparison result; and
    (d2) adjusting the amplification factor based on the comparison result.

11. A method according to claim 10, wherein said adjusting step comprises:
    (i) gradually adjusting the amplification factor upwardly when the level of the high frequency components is lower than the reference value; and
    (ii) gradually adjusting the amplification factor downwardly when the level of the high frequency components is higher than the reference value.

12. A method according to claim 11, wherein the digital signal is a musical tone audio signal.

13. A method according to claim 10, wherein said suppressing step suppresses the high frequency component based on the comparison result.

14. An apparatus, comprising:
    a preprocessor for receiving a digital signal having high and low frequency components, amplifying the high frequency components according to an amplification factor to produce amplified high frequency components, interpolating the amplified high frequency components to produce interpolated high frequency components, and adding the low frequency components and the interpolated high frequency components to produce an output digital signal;
    a digital-to-analog (D/A) converter connected to said preprocessor to convert the output digital signal into an analog signal; and a post-amplifier connected to said D/A converter to suppress a high frequency component of the analog signal.

15. An apparatus according to claim 14, wherein said preprocessor amplifies only the high frequency components of the digital signal.

16. An apparatus according to claim 15, wherein said preprocessor compares levels of high frequency components with a reference value to produce a comparison result, and adjusts the amplification factor based on the comparison result.

17. An apparatus, comprising:
a preprocessor for receiving a digital musical tone audio signal having high and low frequency components, amplifying only the high frequency components according to an amplification factor to produce amplified high frequency components to produce interpolated high frequency components, and adding the low frequency components and the interpolated high frequency components to produce an output digital signal;
a digital-to-analog (D/A) converter connected to said preprocessor to convert the output digital signal into an analog musical tone audio signal; and
a post-amplifier connected to said D/A converter to suppress a high frequency component to the analog musical tone audio analog signal.

18. An apparatus according to claim 17, wherein said preprocessor compares levels of the high frequency components with a reference value to produce a comparison result, and adjusts the amplification factor based on the comparison result.

19. An apparatus according to claim 17, wherein said apparatus is a compact disk player.

20. An apparatus according to claim 17, wherein said apparatus is a digital audio tape player.

* * * * *